United States Patent
Heydari et al.

(10) Patent No.: US 10,243,523 B2
(45) Date of Patent: Mar. 26, 2019

(54) ULTRA-BROADBAND TRANSIMPEDANCE AMPLIFIERS (TIA) FOR OPTICAL FIBER COMMUNICATIONS

(71) Applicant: THE REGENTS OF THE UNIVERSITY OF CALIFORNIA, Oakland, CA (US)

(72) Inventors: Payam Heydari, Irvine, CA (US); Seyed Mohammad Hossein Mohammadnezhad, Irvine, CA (US); Alireza Karimi Bidhendi, Irvine, CA (US); Michael M. Green, Irvine, CA (US); David Howard, Newport Beach, CA (US); Edward Preisler, Newport Beach, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/725,212

(22) Filed: Oct. 4, 2017

(65) Prior Publication Data
US 2018/0102749 A1 Apr. 12, 2018

Related U.S. Application Data

(60) Provisional application No. 62/404,145, filed on Oct. 4, 2016.

(51) Int. Cl.
| | | |
|---|---|---|
| H03F 3/08 | (2006.01) | |
| H03F 1/48 | (2006.01) | |
| H03F 1/34 | (2006.01) | |
| H03F 1/42 | (2006.01) | |
| H03F 3/343 | (2006.01) | |
| H03F 3/50 | (2006.01) | |

(52) U.S. Cl.
CPC ............. *H03F 3/085* (2013.01); *H03F 1/347* (2013.01); *H03F 1/42* (2013.01); *H03F 1/483* (2013.01); *H03F 3/08* (2013.01); *H03F 3/3432* (2013.01); *H03F 3/50* (2013.01); *H03F 2200/135* (2013.01); *H03F 2200/405* (2013.01); *H03F 2203/5036* (2013.01)

(58) Field of Classification Search
USPC ................................ 330/310, 308, 133, 150
See application file for complete search history.

(56) References Cited

U.S. PATENT DOCUMENTS

| | | | | |
|---|---|---|---|---|
| 6,806,778 | B1 * | 10/2004 | Kobayashi | ............ H03F 3/3432 |
| | | | | 330/311 |
| 7,821,335 | B2 * | 10/2010 | Shiramizu | ............... H03F 1/342 |
| | | | | 330/278 |

OTHER PUBLICATIONS

Bowmaster, T., "Synchronous Optical Network (SONET) Transport Systems: Common Generic Criteria", 2005, Issue 4, pp. 1-694.
(Continued)

Primary Examiner — Hieu P Nguyen
(74) Attorney, Agent, or Firm — One LLP

(57) ABSTRACT

Design of ultra broadband transimpedance amplifiers (TIA) for optical fiber communications is disclosed. In one embodiment, a TIA comprises a $g_m$-boosted dual-feedback common-base stage, a level shifter and an RC-degenerated common-emitter stage, and a first emitter-follower stage, wherein the first emitter follower stage is inductively degenerated. An output of the TIA is buffered using a second emitter-follower stage.

14 Claims, 6 Drawing Sheets

(56) References Cited

OTHER PUBLICATIONS

Cvijetic, M., "Optical Transmission Systems Engineering", 2004, Artech House, pp. 166- 168.

Karimi-BIDHEND1, A., et al., "A Silicon-Based Low-Power Broadband Transimpedance Amplifier", IEEE Transactions on Circuits and Systems—I: Regular Papers, 2018, vol. 65, No. 2, pp. 498-509.

Kim, J., et al., "A 40-Gb/s Optical Transceiver Front-End in 45 nm SOI CMOS", IEEE Journal of Solid-State Circuits, 2012, vol. 47, No. 3, pp. 615-626.

Kromer, C., et al., "A Low-Power 20-GHz 52-dBΩ Transimpedance Amplifier in 80-nm CMOS", IEEE Journal of Solid-State Circuits, 2004, vol. 39, No. 6, pp. 885-894.

Kromer, C., et al., "A 40 Gb/s Optical Receiver in 80-nm CMPS for Shirt-Distance High-Density Interconnects", IEEE Asia Solid-State Circuits Conference, 2006, pp. 395-398.

Li, C., et al., "A Low-Power 26-GHz Transformer-Based Regulated Cascode SiGe BiCMOS Transimpedance Amplifier", IEEE Journal of Solid-State Circuits, 2013, vol. 48, No. 5, pp. 1264-1275.

Liao, C.F., et al., "40 Gb/s Transimpedance-AGC Amplifier and CDR Circuit for Broadband Data Receivers in 90 nm CMOS", IEEE Journal of Solid-State Circuits, 2008, vol. 43, No. 3, pp. 642-655.

Pi, D., et al., "A Synthesis-Based Bandwidth Enhancement Technique for CMOS Amplifiers: Theory and Design", IEEE Journal of Solid-State Circuits, 2011, vol. 46, No. 2, pp. 392-402.

Preisler, E., et al., "A Millimeter-Wave Capable SiGe BiCMOS Process with 270GHz $F_{MAX}$HBTs Designed for High vol. Manufacturing", IEEE Bipolar/BiCMOS Circuits and Technology Meeting, 2011, pp. 1-4.

Säckinger, E., "Broadband Circuits for Optical Fiber Communication", 2005, pp. 105-155.

Takemoto, T., et al., "A 25 Gb/s x 4-channel 74 mW/ch Transimpedance Amplifier in 65 nm CMOS", IEEE CICC, 2010, pp. 1-4.

Weiner, J. S., et al., "SiGe Differential Transimpedance Amplifier With 50-GHz Bandwidth", IEEE Journal of Solid-State Circuits, 2003, vol. 38, No. 9, pp. 1512-1517.

Weiner, J. S., et al., "An InGaAs—InP HBT Differential Transimpedance Amplifier With 47-GHz Bandwidth", IEEE Journal of Solid-State Circuits, 2004, vol. 39, No. 10, pp. 1720-1723.

Ye, R.F., et al., "Two Cmos Dual-Feedback Common-Gate Low-Noise Amplifiers With Wideband Input and Noise Matching", IEEE Transactions on Microwave Theory and Techniques, 2013, vol. 61, No. 10, pp. 3690-3699

* cited by examiner

| Ref. | [12] | [13] | Present TIA |
|---|---|---|---|
| Process | DHBT $f_T$=160 GHz | SiGe $f_T$=200 GHz | SiGe $f_T$=180 GHz |
| BW (GHz) | 47 | 50 | >50 |
| $Z_T$ (dBΩ) | 50* | 43* | 41 |
| $C_{PD}$ (fF) | - | - | 100 |
| Noise (pA/√Hz) | 35** | 30** | 35.4*** |
| Power (mW) | 458 | 182 | 24 |
| BW.Ω/$P_{DC}$ (Ω/pJ) [1] | 64.7 | 77.4 | 233.75 |

* Single-ended gain    Measured up to 40 GHz   * Measured up to 70 GHz

FIG. 6

[12] J. S. Weiner, et al., "An InGaAs-InP HBT differential transimpedance amplifier with 47-GHz bandwidth," *IEEE J. Solid-State Circuits*, vol. 39, no. 10, pp. 1720–1723, Oct. 2004.
[13] J. S. Weiner, et al., "SiGe differential transimpedance amplifier with 50-GHz bandwidth," *IEEE J. Solid-State Circuits*, vol. 38, no. 9, pp. 1512–1517, Sep. 2003.

ULTRA-BROADBAND TRANSIMPEDANCE AMPLIFIERS (TIA) FOR OPTICAL FIBER COMMUNICATIONS

CROSS REFERENCE TO RELATED APPLICATIONS

The present application claims priority to U.S. Provisional Application No. 62/404,145, titled "Design of Ultra-Broadband Transimpedance Amplifiers (TIA) for Optical Fiber Communications," filed Oct. 4, 2016, the contents of which are hereby incorporated by reference herein in their entirety.

FIELD

The embodiments described herein relate generally to transimpedance amplifiers (TIAs), and more specifically to ultra-broadband TIAs for optical fiber communications.

BACKGROUND

The exponential increase in the amount of data processing that is required by a client device, together with the continuously expanding availability of internet access to a growing number of client devices populated across multiple continents, introduces a technically complex and demanding challenge to an infrastructure handling a tremendous amount of data related to such data processing. Specifically, storage centers must be able to handle terabytes of data and a constituent interconnect network must transfer the terabytes of data among the storage centers or from individual storage centers to client devices at rates on order of terabits per second.

Fiber-optic communication is a method of transmitting information from one place to another by sending pulses of light through an optical fiber. The light forms an electromagnetic carrier wave that is modulated to carry information. Fiber is preferred over electrical cabling when high bandwidth, long distance, or immunity to electromagnetic interference are required.

The development of single-channel and multi-channel optical fiber transceivers has facilitated ultrahigh data-rate communications. An optical fiber shows low insertion loss and, contrary to conventional electrical transmission lines, does not suffer from skin effect at high frequencies.

Skin effect is the tendency of an alternating electric current (AC) to become distributed within a conductor such that the current density is largest near the surface of the conductor, and decreases with greater depths in the conductor. The electric current flows mainly at the "skin" of the conductor, between the outer surface and a level called the skin depth. The skin effect causes the effective resistance of the conductor to increase at higher frequencies where the skin depth is smaller, thus reducing the effective cross-section of the conductor. The skin effect is due to opposing eddy currents induced by the changing magnetic field resulting from the alternating current.

A transimpedance amplifier (TIA) is a current-to-voltage converter, most often implemented using an operational amplifier. Appearing as the first stage of an optical receiver chain, a TIA is driven by a photodiode which converts optical power to electrical current. The TIA amplifies the electrical current to a proper voltage level required for a subsequent decision circuit to recover data and clock with minimum bit-error-rate (BER). The design of a TIA entails tight trade-offs between receiver bandwidth, gain, jitter, noise, power dissipation, and chip area.

High-speed 40 Gbps optical transceivers have been reported in J. Kim et al., "A 40-Gb/s Optical Transceiver Front-End in 45 nm SOI CMOS," and C. Kromer et al., "A 40 Gb/s optical receiver in 80-nm CMOS for short-distance high-density interconnects," [1, 2].

Additionally, 40 Gbps single-channel and 4×25 Gbps multi-channel TIAs have been reported in C. Li et al., "A Low-Power 26-GHz Transformer-Based Regulated Cascode SiGe BiCMOS Transimpedance Amplifier," and T. Takemoto et al., "A 25 Gb/s×4-channel 74 mW/ch Transimpedance Amplifier in 65 nm CMOS," [3, 4].

However, multi-channel wireline systems inherently suffer from crosstalk between adjacent channels. Such a signal integrity issue due to crosstalk is aggravated at higher data-rates, as a higher TX power is required to overcome increasingly higher channel impairments and to relax RX sensitivity requirements.

It is within the aforementioned context that a need for ultra-broadband TIA for optical fiber communications has arisen. Through applied effort, ingenuity, and innovation, many of these identified problems have been solved by developing solutions that are included in embodiments of the present disclosure, many examples of which are described in detail herein.

SUMMARY

The specification relates to ultra-broadband transimpedance amplifiers (TIA) for optical fiber communications. Embodiments herein advantageously enable an exemplary broadband single-channel TIA in silicon. The embodiments disclosed herein advantageously provide a broadband single-channel TIA capable of about 41 dBΩ of transimpedance gain across a wide bandwidth greater than 50 GHz. In addition, the embodiments advantageously achieve an open eye diagram for about 50 Gbps data rates and beyond.

In one embodiment, a TIA comprises a $g_m$-boosted dual-feedback common-base stage, a level shifter and an RC-degenerated common-emitter stage, and a first emitter-follower stage, wherein the first emitter follower stage is inductively degenerated. An output of the TIA is preferably buffered using a second emitter-follower stage.

Other systems, methods, features and advantages of the example embodiments will be or will become apparent to one with skill in the art upon examination of the following figures and detailed description.

BRIEF DESCRIPTION

The details of the example embodiments, including fabrication, structure and operation, may be gleaned in part by study of the accompanying figures, in which like reference numerals refer to like parts. The components in the figures are not necessarily to scale, emphasis instead being placed upon illustrating the principles of the example embodiments. Moreover, all illustrations are intended to convey concepts, where relative sizes, shapes and other detailed attributes may be illustrated schematically rather than literally or precisely. In the drawings, the same reference numbers indicate identical or functionally similar elements.

FIG. 6 illustrates a table of prior transimpedance amplifier designs compared to an exemplary transimpedance amplifier (TIA) according to embodiments of the present disclosure.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Figure 1:
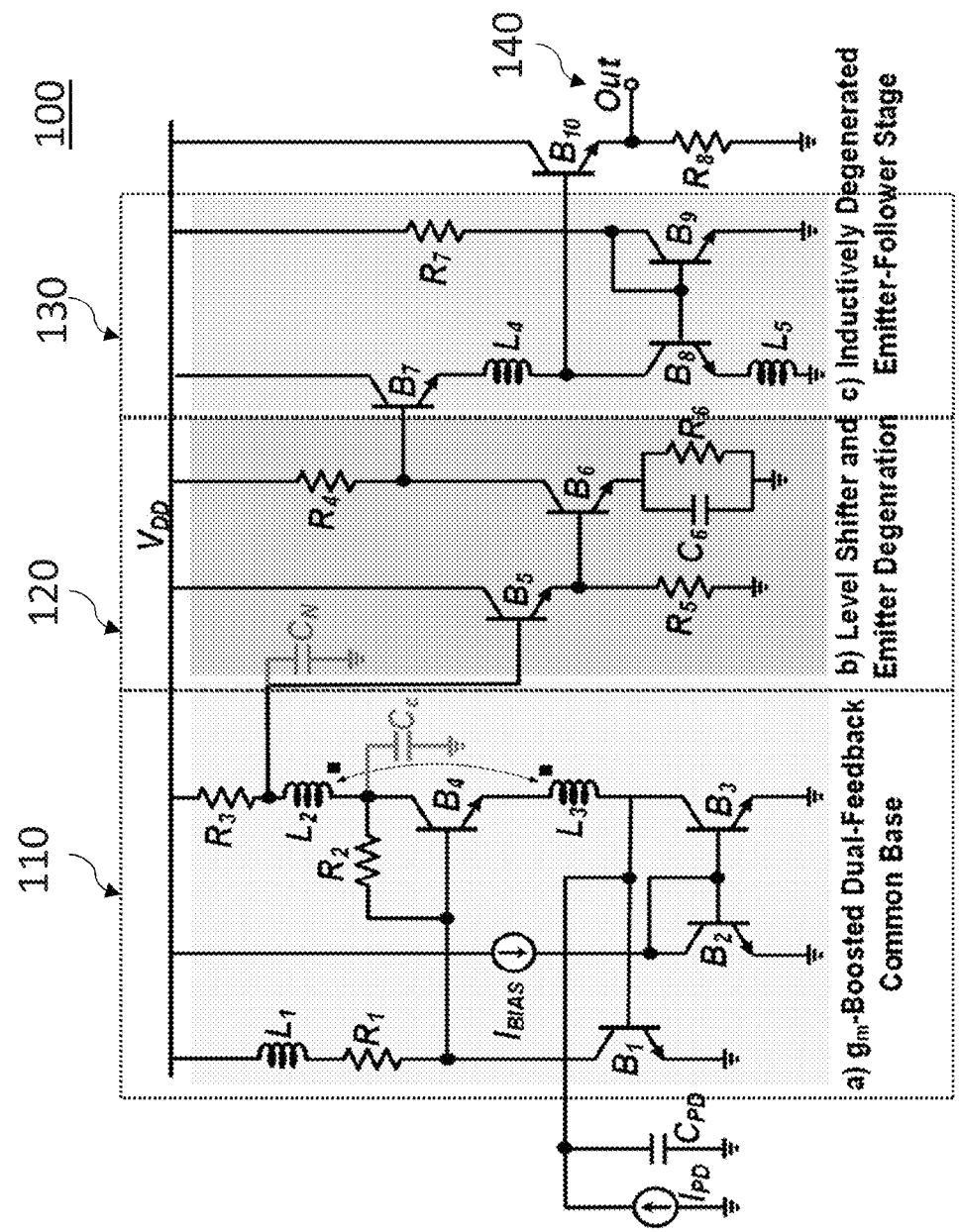
FIG. 1 illustrates an exemplary transimpedance amplifier (TIA) according to embodiments of the present disclosure.

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "exemplary" are used to be examples with no indication of quality level. Like numbers refer to like elements throughout.

Each of the features and teachings disclosed below can be utilized separately or in conjunction with other features and teachings to produce ultra-broadband transimpedance amplifiers (TIA) for optical fiber communications. Representative examples of the present disclosure, which examples utilize many of the features and teachings both separately and in combination, will now be described in further detail with reference to the attached drawings. This detailed description is merely intended to teach a person of skill in the art further details for practicing preferred aspects of the present teachings and is not intended to limit the scope of the disclosure. Therefore, combinations of features and steps disclosed in the following detailed description may not be necessary to practice the disclosure in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Embodiments of the present disclosure enable an exemplary single channel 50 Gbps transimpedance amplifier (TIA) in silicon. In certain embodiments, an exemplary TIA may comprise a $g_m$-boosted dual feedback common base, an RC-degenerated common emitter, and an inductively degenerated emitter follower. Accounting for a 100 fF photodiode's input capacitance, the exemplary TIA achieves a measured transimpedance gain of about 41 dBΩ and a measured RMS input referred current noise spectral density of about 35.4 pA/√Hz over a wide 3 dB bandwidth greater than 50 GHz. The exemplary TIA achieves an open eye at about 50 Gbps with an RMS jitter of about 2.3 ps (including the jitter contribution of the test fixture). The exemplary TIA chip advantageously occupies about 1×0.575 mm² (including pads) of die area and dissipates about 24 mW from a 2 V supply voltage (i.e., less than 0.5 mW per 1 Gbps).

A. Link Budget Calculations

A link budget is an accounting of all of the gains and losses from a transmitter, through a medium (free space, cable, waveguide, fiber, etc.) to a receiver in a telecommunication system. The link budget accounts for attenuation of a transmitted signal due to propagation, as well as antenna gains, feedline and miscellaneous losses. Randomly varying channel gains such as fading are taken into account by adding an amount of margin depending on the anticipated severity of its effects. The amount of margin required can be reduced by the use of mitigating techniques such as antenna diversity or frequency hopping. Link budget requirements for maximum tolerable timing jitter, minimum output swing, dynamic range, and minimum transimpedance gain of an exemplary TIA operating with a BER of 10-12, 50 GHz bandwidth and a data rate of 50 Gbps are briefly described herein.

B. Maximum Tolerable Timing Jitter and Minimum Required Output Swing

The sensitivity of an optical receiver (i.e., minimum detectable input power) is degraded due to effects such as dispersion in the optical fiber, timing jitter from the TIA, and threshold offset in the decision circuit following the TIA. Extra power needs to be transmitted to account for these degrading effects. Power penalty due to timing jitter, $PP_{jitter}$, is expressed by:

$$PP_{jitter} = \frac{1 - (B\sigma_{\Delta t})^2\left(\frac{2\pi^2}{3} - 4\right)}{\left[1 - (B\sigma_{\Delta t})^2\left(\frac{2\pi^2}{3} - 4\right)\right]^2 - 8Q^2\left[(B\sigma_{\Delta t})^2\left(\frac{\pi^2}{3} - 2\right)\right]^2} \quad (1)$$

where $\sigma_{\Delta t}$ denotes timing jitter or the standard deviation of the time variation Δt, B is the bit rate, and Q is the personick factor which is set to 7 for a BER of $10^{-12}$ [6]. From equation (1) above, for a maximum power penalty of 1 dB [7], the timing jitter $\sigma_{\Delta t}$ needs to be less than 12% of the bit interval, which becomes equal to 2.4 ps RMS (root-mean-square) for a 50 Gbps data rate.

Power penalty due to threshold offset, $PP_{th,offset}$, in the decision circuit is expressed by [7]:

$$PP_{th,offset} = 1 + \frac{v_{th,DC}}{v_{o,min}^{pp}} \quad (2)$$

where $v_{o,min}^{pp}$ is the minimum peak-to-peak output swing of the TIA, and $v_{th,DC}$ is the threshold offset in the decision circuit. From equation (2), for a maximum decision threshold offset of 5 mV and a maximum power penalty of 1 dB [7], the peak-to-peak output swing should be greater than 20 mV.

C. Dynamic Range

The dynamic range of an optical receiver determines the range of required input power for operation with a specific BER. The lower-end of a TIA's dynamic range is determined by sensitivity and its upper-end is set forth by photodiode overload current.

The TIA sensitivity is expressed as a function of the signal-to-noise ratio SNR, and the mean-square input-referred noise-current spectral density $\bar{I}_{n,in}^2$ over the TIA's bandwidth (BW) [8], i.e., $$i_{sens}^{pp} = SNR\sqrt{\overline{I_{n,in}^2} \cdot BW} \tag{3}$$

Assuming the TIA has an RMS input-referred noise-current spectral density less than 35 pA/√Hz over a 50 GHz BW, then for operation with an SNR of 14 dB—or a BER of $10^{-12}$ for non-return-to-zero (NRZ) modulation—the minimum sensible input current $i_{sens}^{pp}$ is calculated from equation (3) to be 200 μA.

The TIA's input overload current from photodiode is expressed as [9], $$i_{ovl}^{pp} = \min\left\{\frac{v_{i,ovl}^{pp}}{Z_{in}}, \frac{v_{o,ovl}^{pp}}{Z_T}\right\} \tag{4}$$

where $v_{i,ovl}^{pp}$ indicates the maximum allowable peak-to-peak swing of the input, $v_{o,ovl}^{pp}$ is the maximum allowable peak-to-peak swing of the output, and $Z_{in}$ and $Z_T$ are the input impedance and transimpedance gain of the TIA, respectively. From equation (4), two observations are made: (a) As the input impedance is reduced, the maximum tolerable input overload current will increase; and (b) The input overload current is limited by maximum allowable input or output voltage swing depending on whether the front-end gain compression first occurs in the input of TIA or its output. For high gain, low input impedance TIAs covering wide bandwidths, the compression occurs first in the output. Assuming a 40 dBΩ TIA with a maximum peak-to-peak output overload swing of 100 mV, the peak-to-peak overload current is calculated from equation (4) to be 1 mA.

D. Minimum Transimpedance Gain

The TIA is required to provide a minimum transimpedance gain to be able to detect the input random bit sequence at the edge of its sensitivity, where the minimum input current from photodiode is comparable with the input-referred noise-current of the TIA. The minimum required transimpedance gain $Z_T$ is expressed by $$Z_T = \frac{v_{o,min}^{pp}}{i_{sens}^{pp}} \tag{5}$$

Therefore, for an $i_{sens}^{pp}$ of 200 μA and a $v_{o,min}^{pp}$ of 20 mV, the minimum required transimpedance gain is calculated from equation (5) to be 40 dBΩ.

FIG. 1 illustrates a schematic of an exemplary transimpedance amplifier (TIA) according to embodiments of the present disclosure. According to one embodiment, TIA 100 (a) a $g_m$-boosted dual-feedback common-base stage 110, (b) a level shifter and an RC-degenerated common-emitter stage 120, and (c) an inductively degenerated emitter-follower stage 130. The output 140 of the core TIA is buffered using another emitter-follower stage $B_{10}$.

E. $G_m$-Boosted Dual-Feedback Stage

The first stage of the TIA 100 is a $g_m$-boosted common-base stage 110 ($B_4$) with a shunt-in-shunt-out positive feedback realized with a mutually coupled $L_2$-$L_3$ inductor pair, and a local resistive shunt-in-shunt-out negative feedback ($R_2$). To enhance the stage BW, the $g_m$-boosting transistor, $B_1$, drives a series $R_1$-$L_1$ load, where $R_1$ and $L_1$ values are optimized to expand the BW while ensuring a flat group delay response [10].

E.1 Input Impedance

The input impedance of the $g_m$-boosted dual-feedback common-base stage 110 in FIG. 1 is calculated to be ($R_2$ is neglected for the sake of brevity):

$$Z_{in}(\omega) \cong \frac{1}{g_{m_{eff}}} == \frac{1 + jg_{m_4}L_3\omega\left(1 - \frac{nk}{\xi(\omega)}\right)}{g_{m_4}(1 + g_{m_1}(R_1 + jL_1\omega)) + jC_{\pi,1}\omega} \tag{6}$$

in which, $$\xi(\omega) \approx 1 + \frac{1}{2}\left(\frac{\omega}{\omega_T}\right)^2 \tag{7}$$

where $g_{m_1}$ and $g_{m_4}$ are the transconductance of transistors $B_1$ and $B_4$, respectively, $\omega_T$ is the transit angular frequency, n is the turn-ratio of the transformer formed by mutually coupled inductors $L_2$-$L_3$, and k is the coupling factor. The $g_m$-boosted dual-feedback stage 110 reduces the input impedance of the TIA 100 by increasing the transconductance of $B_4$; thereby, enhancing the bandwidth by pushing the TIA's 100 input pole to higher frequencies. $R_2$ lowers the impedance at the base of $B_4$, allowing another degree of freedom to adjust the gain and bandwidth of the first stage 110.

E.2 Transimpedance Gain

The normalized transimpedance gain of the $g_m$-boosted dual-feedback common-base stage 110 is calculated to be [11]:

$$Z_T(\omega) \cong \frac{V_{out}}{I_{PD}} == \frac{R_3}{1 - \frac{\omega^2}{\omega_0^2}\frac{C_{C,N}}{m} + \frac{j\omega}{\omega_0}\left[1 - \frac{\omega^2}{\omega_0^2}\frac{C_{C,N}(1 - C_{C,N})}{m}\right]} \tag{8}$$

in which, $$\omega_0 = \frac{1}{R_3(C_C + C_N)}, C_{C,N} = \frac{C_C}{C_C + C_N}, \tag{9}$$

$$m = \frac{R_3^2(C_C + C_N)}{L_2(1 - k^2)}$$

where $C_N$ is the capacitor seen from base of $B_5$ and $C_C$ is the capacitor seen from the collector of $B_4$ (FIG. 1). From equation (8), the positive feedback transformer also exhibits a series inductive peaking behavior at the output of the $g_m$-boosted dual-feedback common-base stage 110, extending the bandwidth beyond a conventional common-base stage.

F. Level Shifter and RC-Degenerated Stage 120

The voltage gain frequency response of the RC-degenerated common-emitter stage 120 is:

$$A_{v_{ED}}(\omega) = \frac{g_{m_6} R_4 (1 + jR_6 C_6 \omega)}{(1 + g_{m_6} R_6) + jR_6 C_6 \omega} \quad (11)$$

The RC-degenerated common-emmitter stage 120 introduces a zero at frequency $1/(2\pi R_6 C_6)$ and a high frequency pole at $(1+g_{m_6} R_6)/2\pi R_6 C_6$. Placing the zero frequency close to the previous stages' dominant pole results in bandwidth enhancement, but at the same time increases the jitter peaking in eye diagram. A level shifter ($B_5$, $R_5$) is thus added before the emitter degeneration stage for optimum biasing and varactor $C_6$ is used to tune the zero frequency based on this existing trade-off between bandwidth enhancement and jitter peaking.

G. Inductively Degenerated Emitter Follower Stage 130

Following the RC-degenerated common-emitter stage 120 is an emitter-follower stage 130 modified with two inductors $L_4$ and $L_5$. The voltage gain frequency response of the emitter-follower stage 130 is expressed as:

$$A_{v_{ind,EF}}(\omega) \cong \frac{r_{o,8} r_{\pi,8} + j(g_{m_8} r_{o,8} r_{\pi,8} L_5)\omega}{\frac{r_{\pi,8}}{g_{m_7}} - L_4 L_5 \omega^2 + j(g_{m_8} r_{o,8} r_{\pi,8} L_5)\omega} \quad (12)$$

The inductor $L_4$ introduces a series peaking behavior to the output 140 of the TIA 100, resulting in further BW enhancement. The inductor $L_5$ degenerates this emitter-follower stage 130 by introducing a zero to the frequency response and improves linearity of the TIA 100. This zero frequency is tuned by optimizing the biasing and the inductor value based on the trade-off between bandwidth enhancement and jitter peaking.

Based on post-layout and EM simulations, the exemplary TIA 100 shows a transimpedance gain of 42 dBΩ (compared to link budget calculation of 40 dBΩ) over a bandwidth greater than 50 GHz. Link budget calculations predict a dynamic range between 200 µA and 1 mA for photodiode current. For a 350 µA, 50 Gbps, $2^{15}$-1 input random bit sequence, the TIA 100 shows an open eye with an RMS jitter of 880 fs (link budget: 2.4 ps). Therefore, the simulation results of the proposed TIA 100 all satisfy the link budget calculations discussed above.

Figure 2:
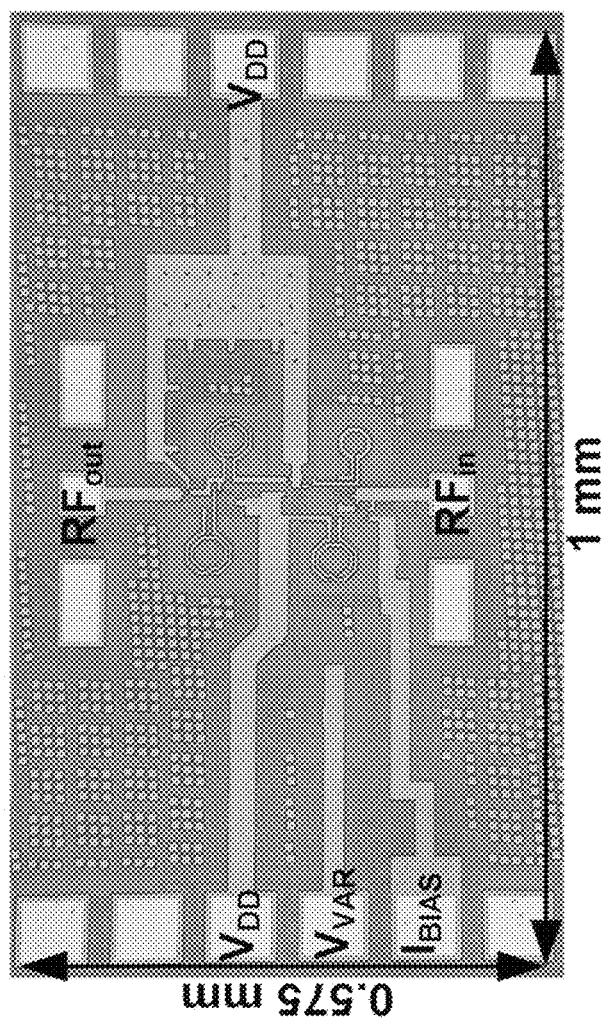
FIG. 2 illustrates a die microphotograph of an exemplary transimpedance amplifier (TIA) implemented in a 130 nm SiGe BiCMOS process according to embodiments of the present disclosure.

FIG. 2 illustrates a die microphotograph 200 of an exemplary transimpedance amplifier (TIA) implemented in a 130 nm SiGe BiCMOS process according to embodiments of the present disclosure. The TIA chip occupies 1×0.575 mm² (including pads) of die area. An on-chip 100 fF metal capacitor accounts for the photodiode parasitic capacitance.

Figure 3:
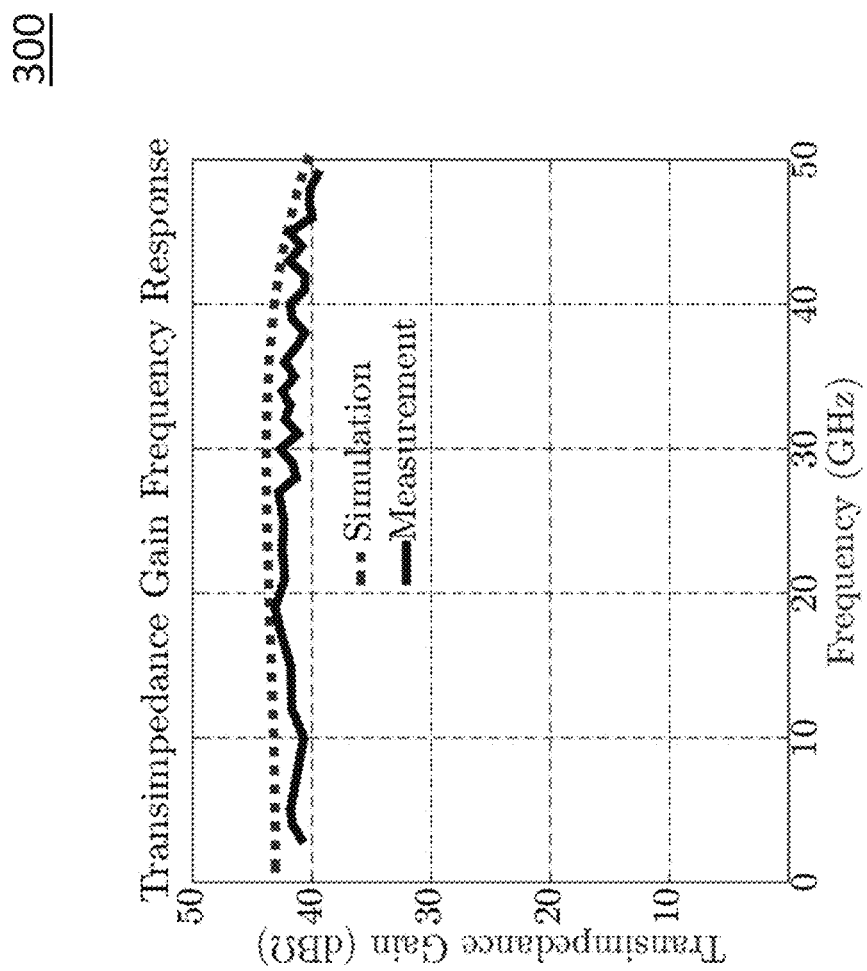
FIG. 3 illustrates simulated and measured transimpedance gain vs. frequency of an exemplary transimpedance amplifier (TIA) according to embodiments of the present disclosure.

FIG. 3 illustrates simulated and measured transimpedance gain vs. frequency 300 of an exemplary transimpedance amplifier (TIA) according to embodiments of the present disclosure. A measured transimpedance gain of 41 dBΩ across a wide bandwidth greater than 50 GHz is achieved with great agreement between measurement and simulation. It is noteworthy that the upper frequency of 50 GHz is limited by bandwidth of the spectrum analyzer.

Figure 4:
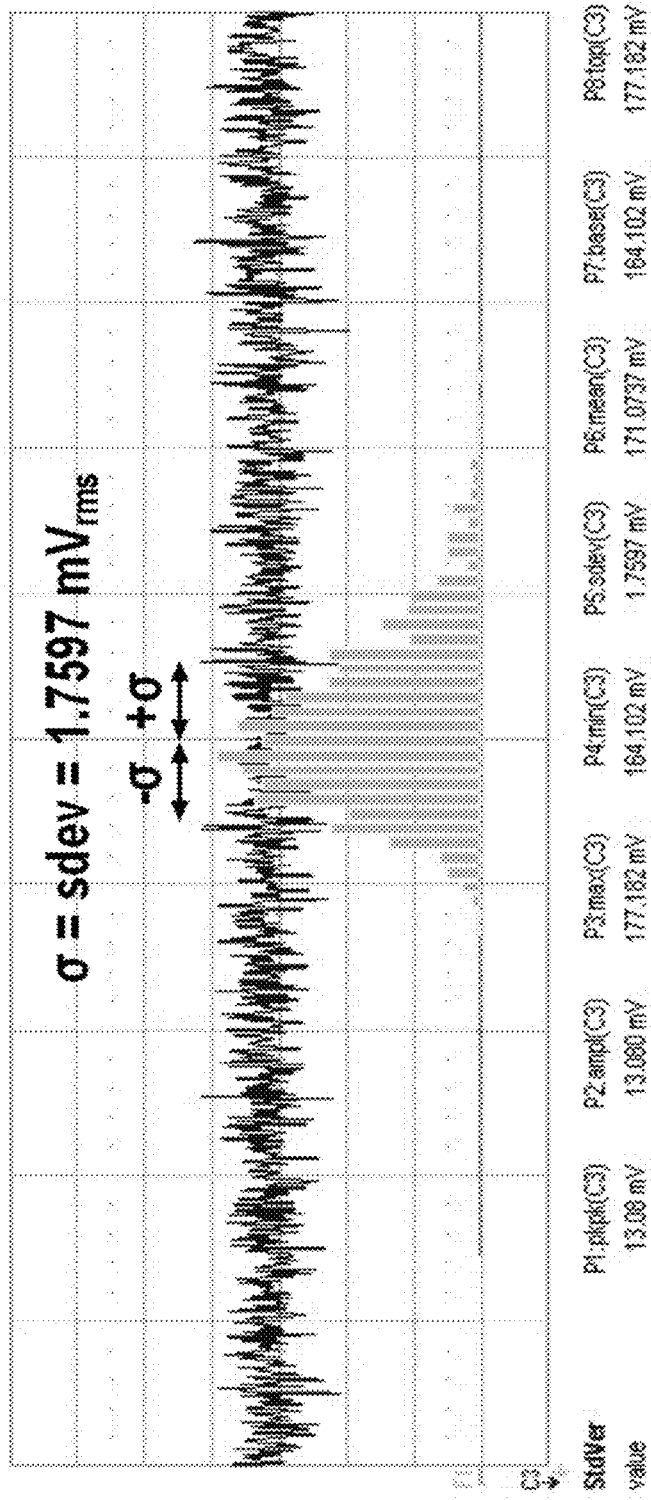
FIG. 4 illustrates a histogram of integrated output noise of an exemplary transimpedance amplifier (TIA) according to embodiments of the present disclosure.

FIG. 4 illustrates a histogram 400 of integrated output noise of an exemplary transimpedance amplifier (TIA) according to embodiments of the present disclosure. The histogram 400 was measured using the histogram function of a Lecroy® 100H sampling oscilloscope. The RMS input-referred current-noise spectral density of the TIA is 35.4 pA/√Hz over a 50 GHz BW, after de-embedding the scope's RMS noise of 1.45 mV from 1.76 mV RMS standard deviation.

Figure 5:
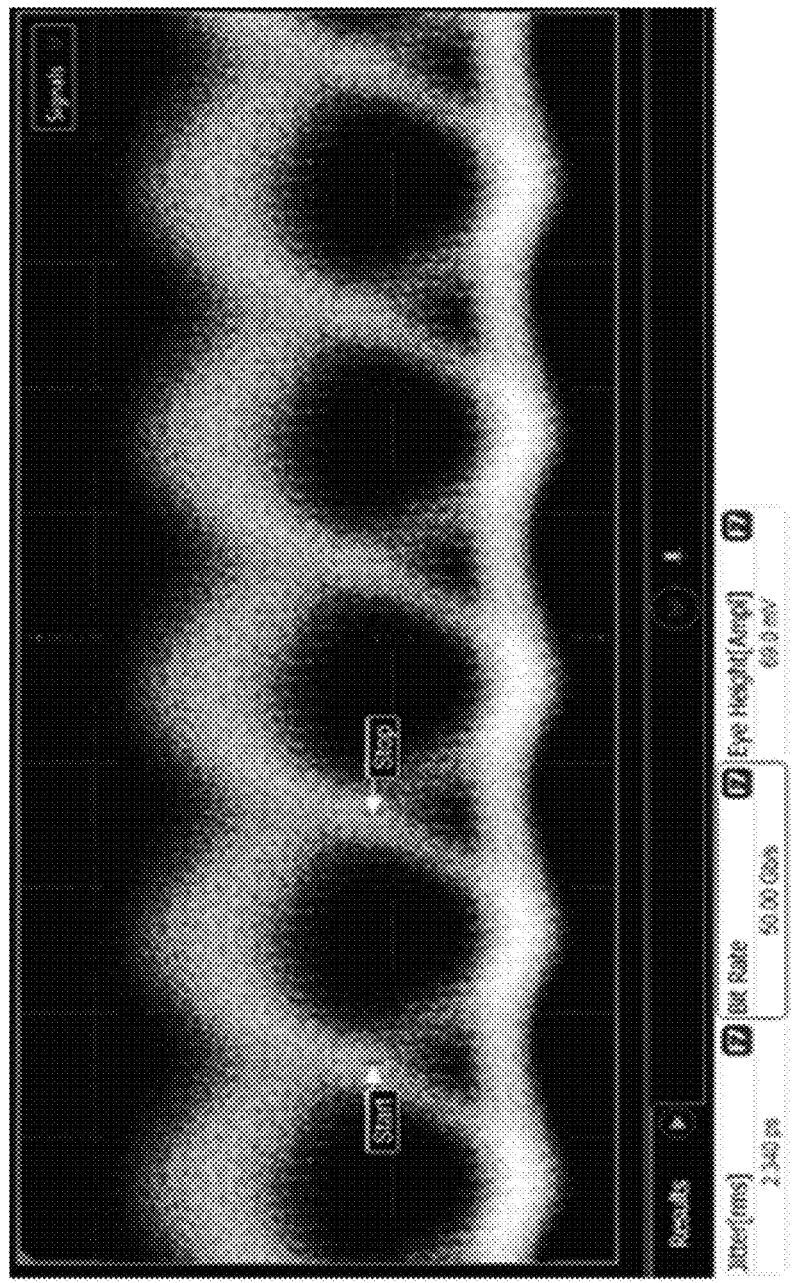
FIG. 5 illustrates a measured eye diagram when a 350 µA $2^{15}$-1 random bit sequence is applied to the input of an exemplary transimpedance amplifier (TIA) according to embodiments of the present disclosure.

FIG. 5 illustrates a measured eye diagram 500 when a 350 µA $2^{15}$-1 random bit sequence is applied to the input of an exemplary transimpedance amplifier (TIA) according to embodiments of the present disclosure. Eye diagram 500 shows an RMS jitter of 2.34 ps with a 1.1 ps RMS jitter contribution from the test fixture. The vertical eye opening observed in the eye diagram 500 validates the low input-referred noise-current of the present TIA design.

FIG. 6 illustrates a table 600 of prior transimpedance amplifier designs compared to an exemplary transimpedance amplifier (TIA) according to embodiments of the present disclosure. The previously reported TIAs were reported as having ~50 GHz bandwidth (where the best performance is underlined). The present TIA design demonstrates a three-fold improvement in FoM (defined as FoM=BW×Gain/$P_{DC}$), due to its wide bandwidth and very low power dissipation.

A novel low-power 50 Gbps transimpedance amplifier (TIA) with a wideband flat transimpedance gain frequency response has been disclosed. The TIA introduces a novel $g_m$-boosted dual-feedback stage to relax the trade-off between input noise, bandwidth, and transimpedance gain. Additionally, a varactor-based emitter degeneration stage and a new inductively degenerated emitter-follower stage were designed for further bandwidth enhancement with minimal jitter contribution to eye diagram. Link budget calculations were presented for further verification of measurement and post-layout simulation results.

In the foregoing specification, all features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances entities are described herein as being coupled to other entities. It should be understood that the terms "coupled" and "connected" (or any of their forms) are used interchangeably herein and, in both cases, are generic to the direct coupling of two entities (without any non-negligible intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

While the above is a complete description of exemplary specific embodiments of the disclosure, additional embodiments are also possible. Thus, the above description should not be taken as limiting the scope of the disclosure, which is defined by the appended claims along with their full scope of equivalents.

APPENDIX OF REFERENCES

[1] J. Kim et al., "A 40-Gb/s Optical Transceiver Front-End in 45 nm SOI CMOS," *IEEEJ. Solid-State Circuits.*, vol. 47, no. 3, pp. 615-626, March 2012.

[2] C. Kromer et al., "A 40 Gb/s optical receiver in 80-nm CMOS for short-distance high-density interconnects," in *Proc. 2006 IEEE Asia Solid-State Circuits Conf.*, pp. 395-398, November 2006.

[3] C. Li et al., "A Low-Power 26-GHz Transformer-Based Regulated Cascode SiGe BiCMOS Transimpedance Amplifier," *IEEE J. Solid-State Circuits.*, vol. 48, no. 5, pp. 1264-1275, May 2013

[4] T. Takemoto et al., "A 25 Gb/s×4-channel 74 mW/ch Transimpedance Amplifier in 65 nm CMOS," *IEEE CICC*, pp. 1-4, September 2010.

[5] E. Preisler; G. Talor; D. Howard; Z. Yan; R. Booth; J. Zheng; S. Chaudhry; M. Racanelli, "A Millimeter-Wave Capable SiGe BiCMOS Process with 270 GHz FMAX HBTs Designed for High Volume Manufacturing,"*IEEE Bipolar/BiCMOS Circuits and Technology Meeting*, 2011.

[6] M. Cvijetic, *Optical Transmission Systems Engineering*, Artech House, 2004.

[7] T. Bowmaster, *Synchronous Optical Network (SONET) Transport Systems: Common Generic Criteria*, Telcordia, 2005.

[8] E. Sackinger, *Broadband Circuits for Optical Fiber Communication*, John Wiley & Sons, 2005.

[9] C. Kromer et al., "A Low-Power 20-GHz 52-dB Transimpedance Amplifier in 80-nm CMOS," *IEEE J. Solid-State Circuits*, vol. 39, no. 6, pp. 885-894, June 2004.

[10] S. Mohan et al., "Bandwidth Extension in CMOS with Optimized On-Chip Inductors," *IEEE J. Solid-State Circuits*, pp. 346-355, March 2000.

[11] R. Ye et al., "Two CMOS Dual-Feedback Common-Gate Low-Noise Amplifiers With Wideband Input and Noise Matching," *IEEE Trans. on Microwave Theory and Techniques*, vol. 61, no 10, October 2013.

[12] J. S. Weiner, et al., "An InGaAs—InP HBT differential transimpedance amplifier with 47-GHz bandwidth," *IEEE J. Solid-State Circuits*, vol. 39, no. 10, pp. 1720-1723, October 2004.

[13] J. S. Weiner, et al., "SiGe differential transimpedance amplifier with 50-GHz bandwidth," *IEEE., Solid-State Circuits*, vol. 38, no. 9, pp. 1512-1517, September 2003.

The invention claimed is:

1. A transimpedance amplifier (TIA), comprising:
a $g_m$-boosted dual-feedback common-base stage;
a level shifter and an RC-degenerated common-emitter stage; and
a first emitter-follower stage, wherein the first emitter follower stage is inductively degenerated;
wherein an output of the TIA is buffered using a second emitter-follower stage.

2. The TIA of claim 1, wherein the $g_m$-boosted dual-feedback common-base stage comprises:
a shunt-in-shunt-out positive feedback realized with a mutually coupled inductor pair comprising a first inductor ($L_2$) and a second inductor ($L_3$); and
a local resistive shunt-in-shunt-out negative feedback comprising a first resistor ($R_2$).

3. The TIA of claim 2, wherein the $g_m$-boosted dual-feedback common-base stage further comprises:
a $g_m$-boosting transistor ($B_1$) driving a series load comprising a second resistor ($R_1$) and a third inductor ($L_1$).

4. The TIA of claim 1, wherein the RC-degenerated common-emitter stage comprises:
a level shifter comprising a first transistor ($B_5$) and a third resistor ($R_5$); and
an emitter degeneration stage comprising a second transistor ($B_6$), a fourth resistor ($R_6$), and a varactor comprising a first capacitor ($C_6$).

5. The TIA of claim 4, wherein the RC-degenerated common-emitter stage introduces a zero pole at a first frequency, wherein the first frequency is $1/(2\pi R_6 C_6)$.

6. The TIA of claim 4, wherein the RC-degenerated common-emitter stage introduces a high frequency pole at a second frequency, wherein the second frequency is $(1+g_{m_6}R_6)/2\pi R_6 C_6$.

7. The TIA of claim 1, wherein the first emitter-follower stage comprises:
a fourth inductor ($L_4$); and
a fifth inductor ($L_5$);
wherein the fourth inductor ($L_4$) introduces a series peaking behavior to the output of the transimpedance amplifier (TIA); and
wherein the fifth inductor ($L_5$) degenerates the first emitter-follower stage.

8. A method of converting an input current signal to an output voltage signal using a transimpedance amplifier (TIA), the method comprising:
applying the input current signal to a $g_m$-boosted dual-feedback common-base stage of the TIA;
electrically coupling the $g_m$-boosted dual-feedback common-base stage of the TIA with a level shifter and RC-degenerated common-emitter stage of the TIA;
electrically coupling the level shifter and RC-degenerated common-emitter stage with a first emitter-follower stage of the TIA, wherein the first emitter follower stage is inductively degenerated; and
buffering the output voltage signal using a second emitter-follower stage.

9. The method of claim 8, wherein the $g_m$-boosted dual-feedback common-base stage of the TIA comprises:
a shunt-in-shunt-out positive feedback realized with a mutually coupled inductor pair comprising a first inductor ($L_2$) and a second inductor ($L_3$); and
a local resistive shunt-in-shunt-out negative feedback comprising a first resistor ($R_2$).

10. The method of claim 9, wherein the $g_m$-boosted dual-feedback common-base stage of the TIA further comprises:
a $g_m$-boosting transistor ($B_1$) driving a series load comprising a second resistor ($R_1$) and a third inductor ($L_1$).

11. The method of claim 8, wherein the RC-degenerated common-emitter stage of the TIA comprises:
a level shifter comprising a first transistor ($B_5$) and a third resistor ($R_5$); and
an emitter degeneration stage comprising a second transistor ($B_6$), a fourth resistor ($R_6$), and a varactor comprising a first capacitor ($C_6$).

12. The method of claim 11, wherein the RC-degenerated common-emitter stage of the TIA introduces a zero pole at a first frequency, wherein the first frequency is $1/(2\pi R_6 C_6)$.

13. The method of claim 12, wherein the RC-degenerated common-emitter stage of the TIA introduces a high frequency pole at a second frequency, wherein the second frequency is $(1+g_{m_6}R_6)/2\pi R_6 C_6$.

14. The method of claim 8, wherein the first emitter-follower stage of the TIA comprises:
 a fourth inductor ($L_4$); and
 a fifth inductor ($L_5$);
 wherein the fourth inductor ($L_4$) introduces a series peaking behavior to the output of the transimpedance amplifier (TIA); and
 wherein the fifth inductor ($L_5$) degenerates the first emitter-follower stage.

* * * * *